331-98

SEARCH ROOM

Jan. 28, 1958 R. A. DEHN 2,821,630

FREQUENCY SHIFTABLE OSCILLATOR

Filed Nov. 30, 1949

Capacitance betw grid and cathode is large providing zero Z at operating frequency.

14 = Anode
17 = Cathode
19 = Heater

Osc. will operate at either $f_1$ or $f_2$

Inventor:
Rudolph A. Dehn,
by Paul A. Frank
His Attorney.

United States Patent Office 2,821,630

Patented Jan. 28, 1958

2,821,630

FREQUENCY SHIFTABLE OSCILLATOR

Rudolph A. Dehn, Schenectady, N. Y., assignor to General Electric Company, a corporation of New York Application November 30, 1949, Serial No. 130,235

2 Claims. (Cl. 250—36)

My invention relates to an ultra-high frequency system having an electronic frequency switching arrangement.

In ultra-high frequency systems, it is often desirable to switch the oscillation energy from one frequency channel to another. Inasmuch as the resonator frequency is essentially determined by its dimensions, it is difficult to switch the frequency instantaneously and simply without employing moving parts or lowering the efficiency of the resonator.

It is an object of my invention to provide a simple and efficient arrangement for electronically switching an ultra-high frequency oscillator output from one frequency to another.

It is a further object of my invention to provide an ultra-high frequency oscillator circuit in which one of a plurality of different frequencies of oscillation may be selected solely by proper choice of operating voltage.

According to my invention, I employ in an oscillator a plurality of ultra-high frequency resonators individually tuned to the same resonant frequency and tightly coupled together to provide a maximum system impedance at a plurality of resonant frequencies. The resonator system is excited by an electron discharge device whose oscillating frequency is determined by an operating voltage applied to its electrodes. With the oscillator discharge device and the resonator system oscillating at one of the resonant frequencies of the system, according to the value of the voltage applied to the discharge device electrodes, the oscillator may be electronically switched to one of the other resonant frequencies by appropriately changing the discharge device operating voltage.

The features which I desire to protect herein are pointed out with particularity in the appended claims. The invention itself, together with further objects and advantages thereof, may best be understood by reference to the following description taken in connection with the drawings in which Fig. 1 illustrates an ultra-high frequency oscillator embodying my invention and Fig. 2 graphically illustrates the dual frequency response of the oscillator shown in Fig. 1.

Figure 1:
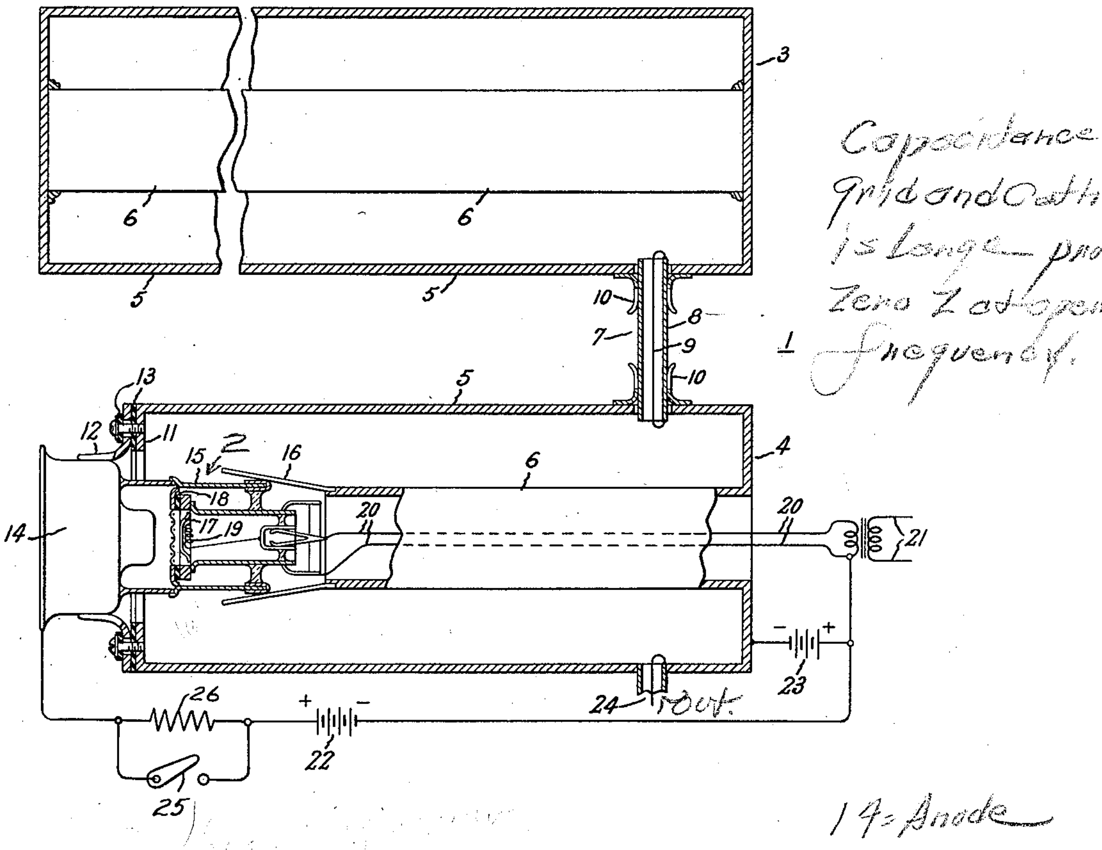

Referring now to Fig. 1, I have shown an oscillator having a resonator system 1 to which an electron discharge device 2 is coupled. The resonator system 1 is preferably comprised of a pair of coaxial resonators 3 and 4, although more than two resonators may be employed if desired. Each resonator is individually tuned to the same frequency $f_0$ by proper selection of the resonator dimensions. The coaxial resonators of the type shown in the drawings each have an outer conductor 5 and a centrally disposed inner conductor 6. In resonator 3, these two conductors are effectively short-circuited to each other at their ends, the short-circuit length being equal to one-half wavelength at the resonant frequency. In resonator 4, the conductors 5 and 6 are effectively short-circuited to each other at one end, the opposite end being terminated in the interelectrode capacitance of the discharge device 2. Resonator 4 is then a capacitance-foreshortened transmission line of length somewhat less than an odd multiple of one-quarter wavelength at the operating frequency.

An adjustable mutual coupling arrangement 7 is employed to couple the resonators 3 and 4 and may suitably take the form of a concentric transmission line section having an outer conductor 8 slidably engaging the resonators 3 and 4 at apertures in their outer conductors. An inner coupling conductor 9 has its respective end portions extending within the resonators 3 and 4 and connected to the outer coupling conductor to provide loops therebetween. Flexible spring fingers 10 or other suitable contact members are provided on the outer conductors of the resonators to grasp the ends of the outer coupling conductor 8. The magnitude of the coupling is varied by rotating the coupling arrangement to change the plane of the coupling loops with respect to the magnetic field of the resonator, 90° rotation yielding the full range of minimum to maximum magnetic field coupling. In order to obtain conveniently a sufficiently tight coupling, the coupling arrangement 7 is preferably installed to link the magnetic fields near the ends of the resonators 3 and 4 where the magnetic field intensity is greater. Electric field coupling of a conventional type may be used instead, if desired.

The electron discharge device 2, which is further described in a following paragraph, is preferably of a type of construction having coaxial parallel planar electrodes adapted to be coupled to a concentric conductor arrangement. An end plate 11 of the resonator 4 is apertured to receive the discharge device, and flexible metallic spring fingers 12, insulatingly spaced from the end plate, such as by thin mica washers 13, are employed to engage the discharge device anode 14. The anode 14 is thus insulated for application of direct current operating voltages but is adequately capacitively coupled to the outer resonator conductor 5 for substantially zero impedance therebetween at high frequencies. The control grid electrode 15 is coupled to the inner resonator conductor 6 by means of spring fingers 16 on the end of the inner conductor. The cathode 17 is suitably spaced from the mesh or perforated portion of the grid 15, but is very slightly spaced from the grid supporting structure by a dielectric washer 18 so that the capacitance therebetween is very large, being substantially zero impedance at high frequencies. The cathode 17 is conventionally provided with a suitable emitting surface such as a coating of alkaline earth oxides, and a heater 19 is provided adjacent the other side of the cathode. One end of the heater is connected to the cathode and the other is brought to a separate heater terminal. A pair of leads 20 are connected to the cathode and heater terminals and extend through a hollow portion of the inner resonator conductor 6 to a suitable external current source 21. An appropriate operating voltage between the anode 14 and cathode 17 of the discharge device is provided by connecting the positive terminal of a direct current voltage source 22 to the anode through a parallel arrangement of a switch 25 and a resistor 26 and connecting the negative terminal to the cathode. An appropriate negative voltage between grid 15 and cathode 17 is provided by battery 23.

An output coupling arrangement 24 may suitably take the form of a concentric transmission line arrangement having one end coupled in a conventional manner to the resonator 4 and the other coupled end to the desired utilization means (not shown). Since the resonators 3 and 4 are coupled to each other by the coupling arrangement 7, the single output coupling arrangement 24 is adequate for the entire oscillator.

As previously mentioned, the discharge device 2 is preferably a type having the general construction features of a triode with coaxial planar electrodes but incorporating a large value of capacitance between the control grid and the cathode for zero impedance at operating frequencies. This type of device has been named the dyotron since it has only two ultra-high frequency electrodes, the cathode and grid being treated as a unit so far as resonator connections are concerned because of their large mutual capacitance coupling. The dyotron is completely described in McArthur Patent 2,747,087, dated May 22, 1956 and issued on application Serial No. 179,854 filed August 16, 1950, a continuation-in-part of application Serial No. 751,358, filed May 29, 1947, now abandoned. For the purposes of this invention, the dyotron type of discharge device is preferably employed because the electron transit angle in its grid cathode region can be readily controlled so that the electron induced current in the anode is 180° out of phase with the grid-anode voltage, thus providing the fundamental requisite for oscillation. Inasmuch as the transit angle is effected by the operating frequency and the anode voltage, the oscillator frequency can also be viewed as a function of the applied anode voltage. This characteristic is due to the large input grid-cathode capacitance, allowing operation of the dyotron as a self-excited oscillator at ultra-high frequencies over a range where the grid-anode admittance has a sufficiently negative conductance component to offset the load conductance of the system. In the operating range so defined, the susceptance component of the grid-anode admittance may be varied by changing the anode voltage, resulting in a change of oscillation frequency.

Figure 2:
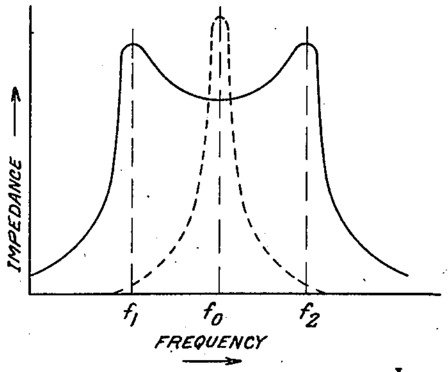

In operation of an oscillator comprising a discharge device and a resonator system, the oscillator operates at the resonant frequency of the system. Since in the embodiment of my invention shown in Fig. 1 the two resonators 3 and 4 are tightly coupled together, their resonant peaks or maximum impedances will occur at frequencies $f_1$ and $f_2$ displaced above and below the individual resonant frequency $f_0$ of each resonator. This phenomenon is due to over-coupling of the resonators and is illustrated by the curve of Fig. 2. In that figure, the impedance of the resonator system, as measured across the anode 14 and grid 15 of the discharge device 2, is illustrated as a function of the oscillator frequency. By adjusting the coupling arrangement 7 from the critical coupling value where the resonator system frequency is $f_0$ to a tighter coupling, the two resonant peaks $f_1$ and $f_2$, which represent resonant impedances somewhat smaller than that appearing at $f_0$ for critical coupling, are displaced in frequency from $f_0$ by amounts lesser and greater, respectively, according to the tightness of the coupling. By selecting the anode voltage for the dyotron discharge device 2, the oscillator will oscillate at either $f_1$ or $f_2$ in accordance with the anode voltage. Since the resonant peaks $f_1$ and $f_2$ are well defined as such, and since the dyotron frequency follows the anode voltage consistently, there is a clean break as the oscillator is switched from one frequency to the other. The switching voltage may be applied or modulated in any suitable manner as desired, such as by alternate closing and opening of switch 25.

While a somewhat similar performance may be obtained by providing a large external shunt capacitance between the grid and cathode of the conventional type of coaxial planar electron discharge device, the dyotron is preferred inasmuch as the built-in capacitance arrangement has a minimum inductance and permits operation of the oscillator over wider frequency ranges. It is obvious, however, that other discharge devices may be employed to excite the resonator system provided that the oscillation frequency can be controlled by controlling the operating voltages applied to the electrodes. It also follows that more than two resonators may be mutually coupled to provide a greater number of resonator resonant frequencies without departing from the spirit of my invention.

It will be understood that numerous other modifications may be made by those skilled in the art without actually departing from the invention. I, therefore, aim in the appended claims to cover all such equivalent variations as come within the true spirit and scope of the foregoing disclosure.

What I claim as new and desire to secure by Letters Patent of the United States is:

1. An ultra-high frequency oscillator comprising an electron discharge device of a type having an oscillation frequency dependent upon the operating voltage applied to its electrodes, a resonant system comprising a plurality of resonators each tuned to the same resonant frequency, said resonators being tightly coupled together to produce a plurality of resonant frequencies for said resonant system, one of said resonators being coupled to said discharge device to excite said resonant system, and means applying to said device operating voltages of values corresponding to desired ones of said resonant frequencies to cause said oscillator to operate at such desired ones of said plurality of resonant frequencies.

2. An ultra-high frequency oscillator having a resonator system comprising a pair of resonators individually tuned to a first frequency, means tightly coupling said resonators together to tune said resonator system to a pair of frequencies displaced respectively above and below said first frequency, an ultra-high frequency electron discharge device coupled to said resonator system, said discharge device being of a type having its oscillation frequency dependent upon the magnitude of its applied anode potential, and means for applying said anode voltage to operate said oscillator at either frequency of said pair of frequencies.

References Cited in the file of this patent

UNITED STATES PATENTS

| | | |
|---|---|---|
| 2,406,850 | Pierce | Sept. 3, 1946 |
| 2,439,387 | Hansen et al. | Apr. 13, 1948 |
| 2,445,811 | Varian | July 27, 1948 |